(12) United States Patent
Cheng et al.

(10) Patent No.: US 9,799,730 B2
(45) Date of Patent: Oct. 24, 2017

(54) FINFETS WITH HIGH QUALITY SOURCE/DRAIN STRUCTURES

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Charan V. V. S. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 14/724,337

(22) Filed: May 28, 2015

(65) Prior Publication Data

US 2016/0351662 A1    Dec. 1, 2016

(51) Int. Cl.
*H01L 29/08*  (2006.01)
*H01L 29/78*  (2006.01)
*H01L 29/161*  (2006.01)
*H01L 29/66*  (2006.01)
*H01L 21/18*  (2006.01)

(52) U.S. Cl.
CPC .......... *H01L 29/0847* (2013.01); *H01L 21/18* (2013.01); *H01L 29/161* (2013.01); *H01L 29/66818* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,787,854 | B1 | 9/2004 | Yang et al. |
| 7,060,539 | B2 | 6/2006 | Chidambarrao et al. |
| 7,250,645 | B1 | 7/2007 | Wang et al. |
| 7,541,267 | B1 | 6/2009 | Wang et al. |
| 2010/0163842 | A1 | 7/2010 | Lai et al. |
| 2012/0058628 | A1 | 3/2012 | Lai et al. |
| 2013/0270652 | A1 | 10/2013 | Liaw |

FOREIGN PATENT DOCUMENTS

CN    103871885    6/2014

*Primary Examiner* — Hrayr A Sayadian
(74) *Attorney, Agent, or Firm* — Scully, Scott, Murphy & Presser, P.C.; Steven J. Meyers (57) ABSTRACT

A semiconductor structure is provided that includes a silicon germanium alloy fin located on a portion of a topmost surface of an insulator layer. A functional gate structure straddles a portion of the silicon germanium alloy fin and is located on other portions of the topmost surface of the insulator layer. A source structure is located on one side of the functional gate structure and a drain structure is located on another side of the functional gate structure. The source structure and the drain structure surround the other portions of the silicon germanium alloy fin and are located on a germanium graded silicon-containing region that is present at a footprint of the other portions of the silicon germanium alloy fin.

11 Claims, 6 Drawing Sheets

FINFETS WITH HIGH QUALITY SOURCE/DRAIN STRUCTURES

BACKGROUND

The present application relates to a semiconductor structure and a method of forming the same. More particularly, the present application relates to a semiconductor structure including a functional gate structure straddling a silicon germanium alloy fin, wherein high quality source/drain structures are formed by epitaxy on opposite sides of the functional gate structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In order to extend these devices for multiple technology nodes, there is a need to boost the performance with high-mobility channels.

A silicon germanium alloy (i.e., SiGe) is one promising channel material that can be used as a semiconductor fin of FinFET devices because of its high-carrier mobility. The epitaxial growth of source/drain structures around such SiGe fins is very challenging due to growth on a damaged sidewall surface of the SiGe fins. As such, there is a need for providing a method in which high quality source/drain structures can be formed around SiGe fins.

SUMMARY

In one aspect of the present application, a semiconductor structure is provided. In accordance with an embodiment of the present application, the semiconductor structure includes a silicon germanium alloy fin located on a portion of a topmost surface of an insulator layer. A functional gate structure straddles a portion of the silicon germanium alloy fin and is located on other portions of the topmost surface of the insulator layer. A source structure is located on one side of the functional gate structure and a drain structure is located on another side of the functional gate structure. The source structure and the drain structure surround other portions of the silicon germanium alloy fin and the source structure and the drain structure are located on a germanium graded silicon-containing region that is present at a footprint of the other portions of the silicon germanium alloy fin.

In another aspect of the present application, a method of forming a semiconductor is provided. In accordance with an embodiment of the present application, the method of the present application includes providing a silicon germanium alloy structure extending upwards from a surface of a silicon layer, the silicon layer is present on a topmost surface of an insulator layer. Next, germanium is diffused from the silicon germanium alloy structure into the silicon layer to convert a portion of the silicon layer that is located directly beneath the silicon germanium alloy structure into a silicon germanium alloy base portion, while also converting other portions of the silicon layer that are located adjacent the silicon germanium alloy base portion into a germanium graded silicon-containing region. A fin protective structure is then formed on a portion of the silicon germanium alloy structure. Epitaxy is then employed to form a source structure on one side of the fin protective structure and a drain structure on another side of the fin protective structure, wherein the source structure and the drain structure surround exposed portions of the silicon germanium alloy structure and are located on each germanium graded silicon-containing region that is present at the footprint of the silicon germanium alloy structure. Next, a portion of the fin protective structure is removed to expose a gate region. Each of the germanium graded silicon-containing regions is then removed from the gate region to expose a portion of a topmost surface of the insulator layer. Next, a functional gate structure is formed straddling another portion of the silicon germanium alloy structure located on the exposed portion of the topmost surface of the insulator layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
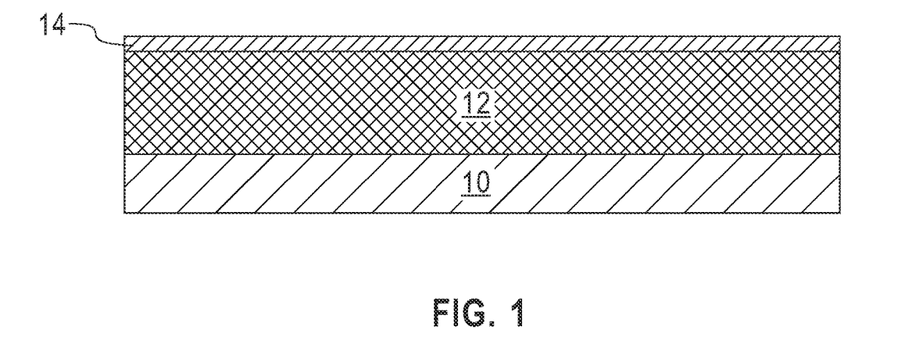
FIG. 1 is a cross sectional view of an exemplary semiconductor structure including, from bottom to top, a handle substrate, an insulator layer and a silicon layer that can be employed in the present application.

Referring first to FIG. 1, there is illustrated an exemplary semiconductor structure including, from bottom to top, a handle substrate 10, an insulator layer 12 and a silicon layer 14 that can be employed in accordance with an embodiment of the present application. Collectively, the handle substrate 10, the insulator layer 12 and the silicon layer 14 may be referred to herein as a semiconductor-on-insulator (SOI) substrate. The handle substrate 10 provides mechanical support for the insulator layer 12 and the silicon layer 14.

In some embodiments of the present application, the handle substrate 10 may comprise a semiconductor material. The term "semiconductor" as used herein in connection with the semiconductor material of the handle substrate 10 (or any other semiconductor material described herein) denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the handle substrate 10 and the silicon layer 14 are both comprised of silicon. In some embodiments, the handle substrate 10 is a non-semiconductor material including, for example, a dielectric material and/or a conductive material. In yet other embodiments, the handle substrate 10 can be omitted and a substrate including insulator layer 12 and silicon layer 14 can be used in the present application.

In some embodiments, the handle substrate 10 and the silicon layer 14 may have a same crystal orientation. In other embodiments, the handle substrate 10 and the silicon layer 14 may have different crystal orientations. The crystal orientation of the handle substrate 10 and/or the silicon layer 14 may be {100}, {110}, or {111}. Other crystallographic orientations besides those specifically mentioned can also be used in the present application. The handle substrate 10 may be a single crystalline semiconductor material, a polycrystalline material, or an amorphous material. The silicon layer 14 is comprised of single crystalline silicon. In some embodiments (not shown), the silicon layer 14 that is located atop the insulator layer 12 can be processed to include semiconductor regions having different crystal orientations.

The insulator layer 12 of the exemplary semiconductor structure shown in FIG. 1 may be a crystalline or non-crystalline oxide and/or nitride. In one embodiment, the insulator layer 12 is an oxide such as, for example, silicon dioxide. In another embodiment, the insulator layer 12 is a nitride such as, for example, silicon nitride or boron nitride. In yet still another embodiment of the present application, the insulator layer 12 may be a multilayered structure such as a stack of, in any order, silicon dioxide and boron nitride.

The exemplary semiconductor structure including the handle substrate 10, insulator layer 12, and the silicon layer 14 may be formed utilizing standard processes known in the art. In one example, the exemplary semiconductor structure shown in FIG. 1 may be formed by SIMOX (Separation by IMplantation of OXygen). In another example, a layer transfer process including wafer bonding may be used to provide the exemplary semiconductor structure shown in FIG. 1.

The thickness of the silicon layer 14 that can be used in the present application can be from 5 nm to 30 nm. Other thicknesses that are lesser than, or greater than, the aforementioned range can also be employed in the present application as the thickness of the silicon layer 14. If the initial thickness of the silicon layer 14 is not in a range that is desired, a thinning step such as, for example, planarization or etching can be used to reduce the thickness of the silicon layer 14 to a value within a desired range prior to further processing.

The thickness of the insulator layer 12 that may be used in the present application can be from 10 nm to 200 nm. Other thicknesses that are lesser than, or greater than, the aforementioned thickness range for the insulator layer 12 can also be used in the present application. The thickness of the handle substrate 10 of the exemplary semiconductor structure shown in FIG. 1 is inconsequential to the present application.

Figure 2:
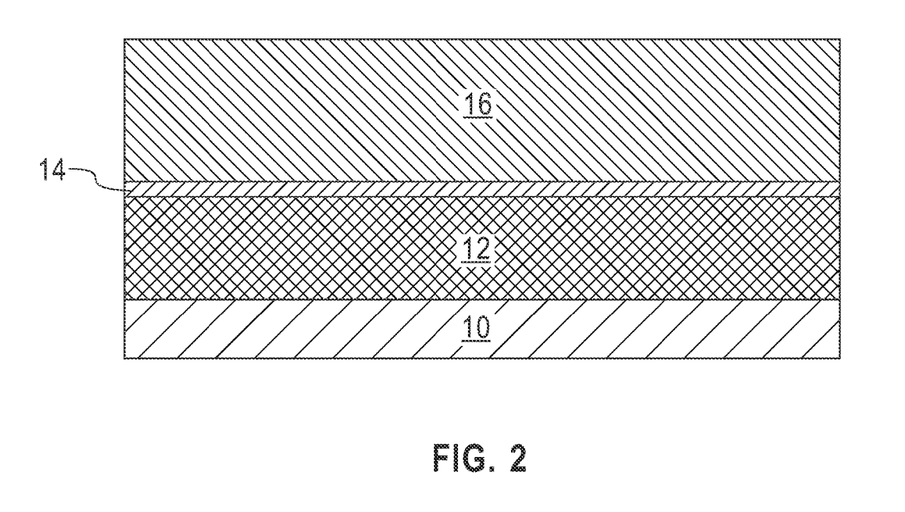
FIG. 2 is a cross sectional view of the exemplary semiconductor structure of FIG. 1 after forming a silicon germanium alloy layer on an exposed surface of the silicon layer.

Referring now to FIG. 2, there is illustrated the exemplary semiconductor structure of FIG. 1 after forming a silicon germanium alloy layer 16 on an exposed surface of the silicon layer 14. The silicon germanium alloy layer 16 that is formed is a contiguous layer that covers an entirety of the underlying silicon layer 14. The silicon germanium alloy layer 16 that is formed can have a first germanium content of from 20 atomic % to 80 atomic % germanium. Other first germanium contents that are lesser than, or greater than, the aforementioned range may also be used in the present application.

The silicon germanium alloy layer 16 is formed by an epitaxial growth (or epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the silicon germanium alloy layer 16 has an epitaxial relationship, i.e., same crystal orientation, as that of the silicon layer 14.

Examples of various epitaxial growth processes that are suitable for use in forming the silicon germanium alloy layer 16 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of silicon germanium alloy layer 16. In some embodiments, the source gas for the deposition of the silicon germanium alloy layer 16 includes a mixture of a silicon containing gas source and a germanium containing gas source or a combined silicon and germanium source gas may be used. Carrier gases like hydrogen, nitrogen, helium and argon can be used.

The thickness of the silicon germanium alloy layer 16 that can be formed in the present application is at or below the critical thickness of a silicon germanium alloy. Above the critical thickness the silicon germanium alloy that is formed is very defective and is not suitable for use as a device channel material. In one example, the thickness of the silicon germanium alloy layer 16 is from 30 nm to 100 nm. Other thicknesses that are lesser than, or greater than, the aforementioned thickness range can also be employed in the present application as long as the thickness is below the limit in which defects form.

Figure 3:
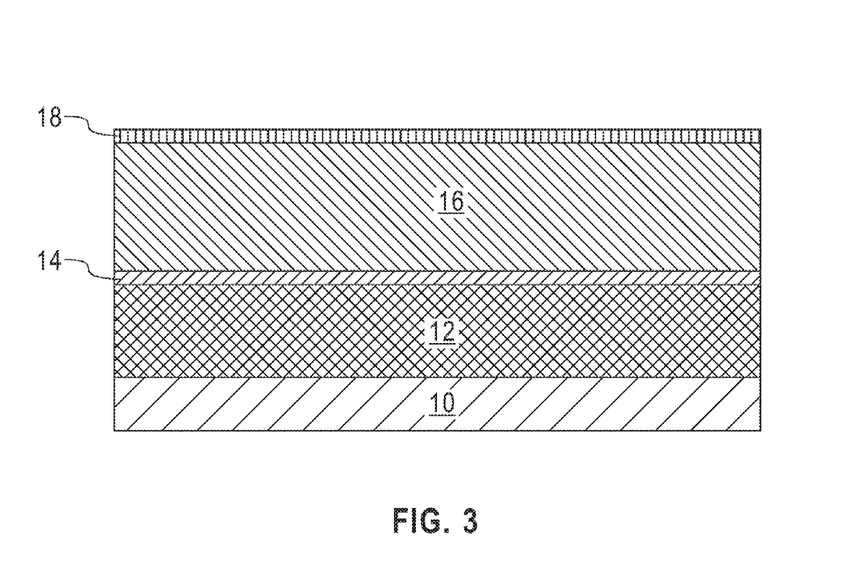
FIG. 3 is a cross sectional view of the exemplary semiconductor of FIG. 2 after forming a hard mask layer on an exposed surface of the silicon germanium alloy layer.

Referring now to FIG. 3, there is illustrated the exemplary semiconductor of FIG. 2 after forming a hard mask layer 18 on an exposed surface of the silicon germanium alloy layer 16. The hard mask layer 18 that is formed is a contiguous layer that covers an entirety of the underlying silicon germanium alloy layer 16.

The hard mask layer 18 comprises at least one hard mask material. The hard mask material that can be employed in the present application as hard mask layer 18 may include a semiconductor oxide, a semiconductor nitride and/or a semiconductor oxynitride. In one embodiment, the hard mask material that can be used in the present application as the hard mask layer 18 may be comprised of silicon dioxide. In another embodiment, the hard mask material that can be used in the present application as the hard mask layer 18 may be comprised of silicon nitride. In yet another embodiment, the hard mask material that can be used in the present application as the hard mask layer 18 may include a hard mask stack of, in any order, silicon dioxide and silicon nitride.

In some embodiments, the hard mask material that can be used in the present application as the hard mask layer 18 can be formed by a deposition process such as, for example, chemical vapor deposition (CVD) or plasma enhanced chemical vapor deposition (PECVD). In other embodiments, the hard mask material that can be used in the present application as the hard mask layer 18 may be formed by a thermal process such as, for example, thermal oxidation and/or thermal nitridation. In yet other embodiments, the hard mask material that can be used in the present application as the hard mask layer 18 may be formed by a combination of a deposition process and a thermal process. The thickness of the hard mask material that can be used in the present application as the hard mask layer 18 may range from 5 nm to 20 nm. Other thicknesses that are lesser than, or greater than, the aforementioned thickness range may also be used as the thickness of hard mask layer 18.

Figure 4:
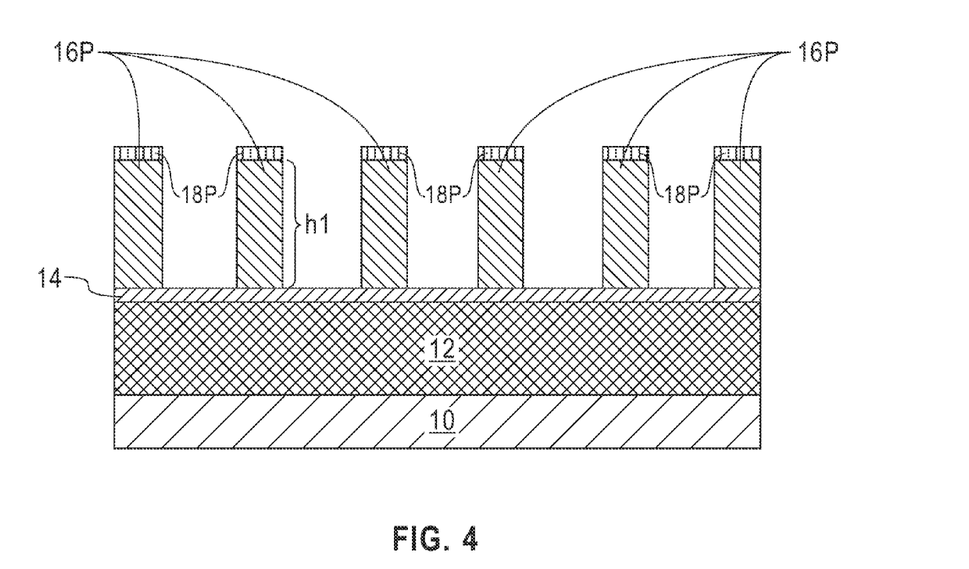
FIG. 4 is a cross sectional view of the exemplary semiconductor structure of FIG. 3 after patterning the hard mask layer and the silicon germanium alloy layer to provide a plurality of silicon germanium alloy structures that that contain a hard mask cap and that extend upwards from the silicon layer.

Referring now to FIG. 4, there is illustrated the exemplary semiconductor structure of FIG. 3 after patterning the hard mask layer 18 and the silicon germanium alloy layer 16 to provide a plurality of silicon germanium alloy structures 16P that that contain a hard mask cap 18P and that extend upwards from the silicon layer 14. Collectively, each hard mask cap 18P and each underlying silicon germanium alloy structure 16P can be referred to herein as a patterned structure. Each silicon germanium alloy structure 16P that is formed comprises a remaining portion of the silicon germanium alloy layer 16. Each hard mask cap 18P that is formed comprises a remaining portion of the hard mask layer 18. As is shown, the sidewall surfaces of each hard mask cap 18P are vertically coincident to sidewall surfaces of the underlying silicon germanium alloy structure 16P. Although a plurality of patterned structures (16P, 18P) are described and illustrated, the present application contemplates an embodiment in which a single patterned structure (16P, 18P) is formed.

In one embodiment, the patterning process used to define the patterned structure shown in FIG. 4 comprises a sidewall image transfer (SIT) process. The SIT process includes forming a contiguous mandrel material layer (not shown) on the hard mask layer 18. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each patterned structure shown in FIG. 4.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers entirely through the hard mask layer 18 and entirely through the underlying silicon germanium alloy layer 16. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to define each patterned structure shown in FIG. 4 can include lithography and etching. Lithography includes forming a photoresist material (not shown) on the hard mask layer 18. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

Each silicon germanium alloy structure 16P that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each silicon germanium alloy structure 16P that is formed has a first height h1. In one embodiment, the first height of each silicon germanium alloy structure 16P is from 10 nm to 100 nm. The width of each silicon germanium alloy structure 16P that is formed can be from 5 nm to 30 nm. Other first heights and widths that are lesser than, or greater than, the aforementioned ranges may also be used in the present application for each silicon germanium alloy structure 16P.

Figure 5:
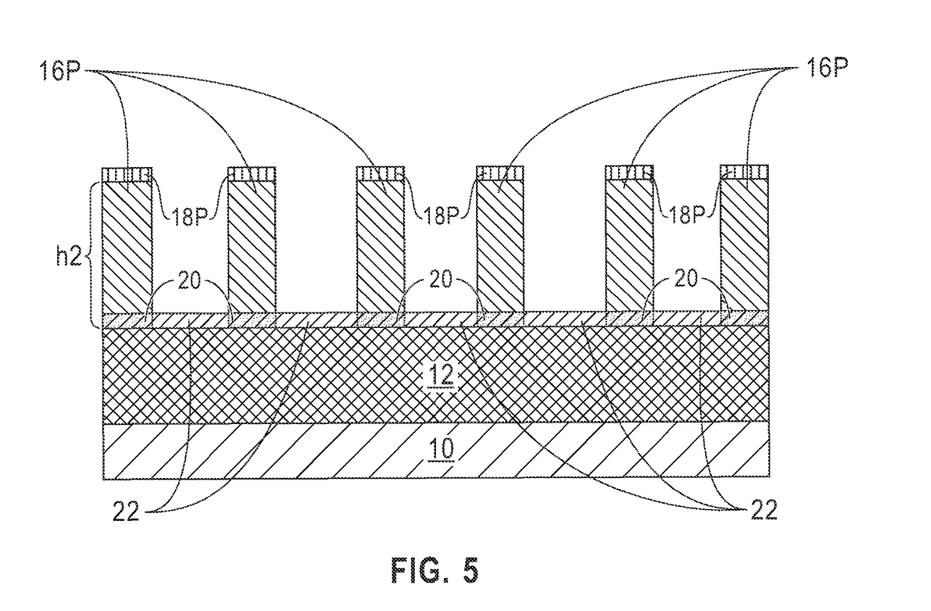
FIG. 5 is a cross sectional view of the exemplary semiconductor structure of FIG. 4 after performing a thermal mixing process which thermally diffuses germanium from each silicon germanium alloy structure into a portion of the silicon layer that is located beneath each silicon germanium alloy structure and provides silicon germanium alloy base portions and germanium graded silicon-containing regions.

Referring now to FIG. 5, there is illustrated the exemplary semiconductor structure of FIG. 4 after performing a thermal mixing process which thermally diffuses germanium from each silicon germanium alloy structure 16P into a portion of the silicon layer 14 that is located beneath each silicon germanium alloy structure 16P. The thermal mixing that is employed in providing the exemplary semiconductor structure shown in FIG. 5 may also be referred to herein as a thermal anneal or a thermal diffusion process. During thermal annealing, germanium is diffused from the silicon germanium alloy structures 16P downward into the underlying silicon layer 14 so as to provide a silicon germanium alloy base portion 20 directly beneath each silicon germanium alloy structure 16P and a germanium graded silicon-containing region 22 that is located between each silicon germanium alloy structure 16P and laterally adjacent each silicon germanium alloy base portion 20.

At this point of the present application, each silicon germanium alloy structure 16P and each underlying silicon germanium alloy base portion 20 have a second germanium content that is less than the first germanium content mentioned above for the silicon germanium alloy layer 16. Although the drawings of the present application illustrate an interface between the silicon germanium alloy structure 16P and the underlying silicon germanium alloy base portion 20, no such interface exists since the silicon germanium alloy structure 16P and the underlying silicon germanium alloy base portion 20 are both comprised of a silicon germanium alloy having the second germanium content. Collectively, each silicon germanium alloy structure 16P and the corresponding underlying silicon germanium alloy base portion 20 constitutes a silicon germanium alloy fin of the present application which has a second height, h2, that is greater than the first height, h1. Notably, the second height, h2, of each silicon germanium alloy fin (16P, 20) is the same of the first height, h1, plus the thickness of the silicon layer 14. Each silicon germanium alloy fin (16P, 20) is formed on a portion of a topmost surface of insulator layer 12. The sidewall surfaces of each silicon germanium alloy structure 16P of the silicon germanium alloy fin are vertically coincident with sidewall surfaces of an underlying silicon germanium alloy base portion 20. Although the present application describes and illustrates the formation of a plurality of silicon germanium alloy fins, the present application also includes an embodiment in which a single silicon germanium alloy fin is formed.

Each germanium graded silicon-containing region 22 has a germanium content that is greatest nearest the sidewalls of a neighboring silicon germanium alloy base portion 20 and the germanium content within the germanium graded silicon-containing region 22 decreases laterally (i.e., side to side) to a central portion that is located between a neighboring pair of silicon germanium alloy base portions 20. At the central portion of the germanium graded silicon-containing region 22, the germanium content may be zero and thus the central portion of the germanium graded silicon-containing region 22 may be composed of only silicon. Each germanium graded silicon-containing region 22 is located on other portions of the topmost surface of the insulator layer 12 and is present at a footprint of each silicon germanium alloy fin (16P, 20). Each germanium graded silicon-containing region 22 has a topmost surface that is coplanar with a topmost surface of each silicon germanium alloy base portion 20.

The thermal anneal that can be used in the present application can be carried out in an inert ambient such as, for example, He, Ar and/or Ne. The thermal anneal can be performed at a temperature from 800° C. to 1350° C. The thermal anneal may include a furnace anneal, a rapid thermal anneal or any other anneal that can provide the exemplary semiconductor structure shown in FIG. 5.

Figure 6:
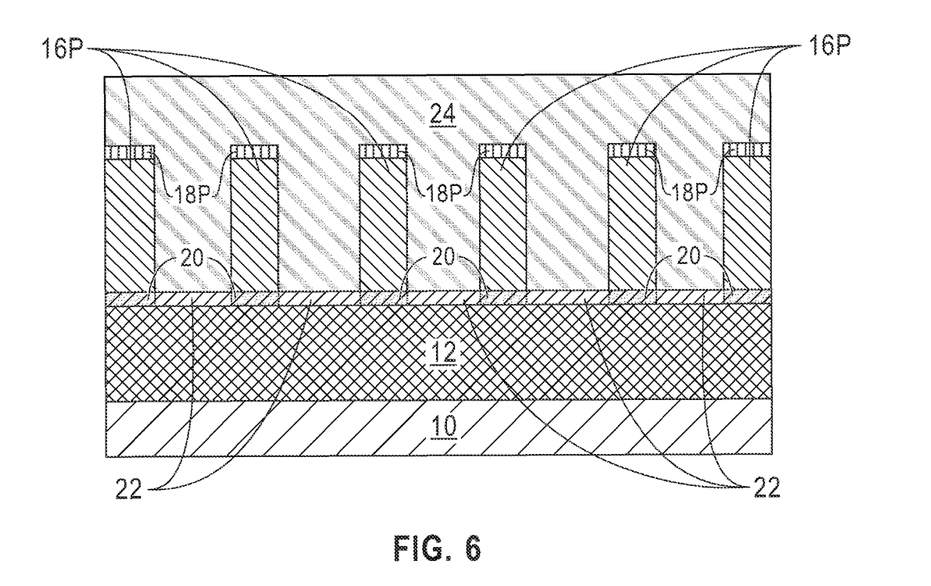
FIG. 6 is a cross sectional view in the source/drain region of the exemplary semiconductor structure of FIG. 5 after forming a fin protective structure containing at least one sacrificial material portion and a dielectric spacer surrounding a portion of each silicon germanium alloy structure.

Referring now to FIG. 6, there is illustrated the exemplary semiconductor structure of FIG. 5 after forming a fin protective structure 24 containing at least one sacrificial material portion and a dielectric spacer surrounding a portion of each silicon germanium alloy structure 16P and on a surface of each germanium graded silicon-containing region 22; other portions of the silicon germanium alloy structures 16P located on either side of the fin protective structure are exposed. The exposed portions of each silicon germanium alloy structure 16P that are not protected by the fin protective structure 24 represent the source/drain regions of the exemplary semiconductor structure. It should be noted that the cross sectional view provided in FIG. 6 (and FIGS. 7-9)

represents a cross sectional view in the source/drain region of the exemplary semiconductor structure of the present application, not the gate region as in FIGS. 1-5 and 10-13. In FIGS. 1-5 and 10-13, the source/drain region would be within a plane that comes into and out of the paper. The fin protective structure 24 protects the gate region of the exemplary semiconductor structure during the processing of the source/drain regions of the exemplary semiconductor structure. Although a single fin protective structure 24 is described and illustrated, a plurality of fin protective structures can be formed on different portions of each silicon germanium alloy structure 16P.

The fin protective structure 24 includes a single sacrificial material layer or a stack of two or more sacrificial materials (i.e., at least one sacrificial material portion not specifically shown in this drawings). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation, may be used.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material is formed. The sacrificial gate cap material may include one of the materials mentioned above for the hard mask layer. The sacrificial gate cap material can be formed utilizing one of the techniques mentioned above for forming the hard mask layer.

After providing the above mentioned sacrificial material stack (or any subset of said sacrificial materials), a photoresist material can be formed atop the uppermost sacrificial material, and thereafter the photoresist material can be patterned by exposing the photoresist material to a pattern of irradiation and then developing the resist material. After providing the patterned photoresist atop the sacrificial gate cap material, an etch such as, for example, an anisotropic dry etch or wet etch process, can be employed to transfer the pattern into the blanket sacrificial material stack. The patterned resist material can be removed after the pattern transfer etch by utilizing a resist stripping process such as, for example, ashing. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

The fin protective structure 24 further includes a dielectric spacer (not specifically shown in this drawing, but represented as element 26 in later drawings of the present application) formed on sidewall surfaces of the at least one sacrificial material portion provided above. The dielectric spacer can be formed by first providing a dielectric spacer material and then etching the dielectric spacer material. Examples of dielectric spacer materials that may be employed in the present application include dielectric oxides, dielectric nitrides and/or dielectric oxynitrides. In one embodiment, the dielectric spacer material used in providing each dielectric spacer is composed of silicon dioxide or silicon nitride. The dielectric spacer material may be provided by a deposition process including, for example, chemical vapor deposition (CVD), plasma enhanced chemical vapor deposition (PECVD), or physical vapor deposition (PVP). The etch used to provide the dielectric spacer may comprise a dry etching process such as, for example, reactive ion etching.

Figure 7:
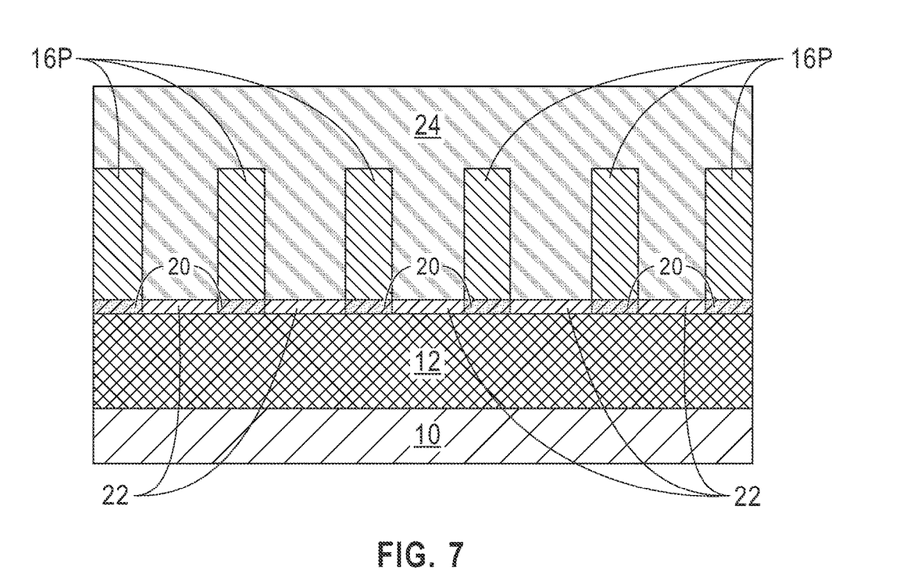
FIG. 7 is a cross sectional view in the source/drain region of the exemplary semiconductor structure of FIG. 6 after removing the hard mask cap from atop portions of each silicon germanium alloy structure not covered by the fin protective structure.

Referring now to FIG. 7, there is illustrated the exemplary semiconductor structure of FIG. 6 after removing the hard mask cap 18P from atop portions of each silicon germanium alloy structure 16P not covered by the fin protective structure 24 and within the source/drain regions of the structure; portions of the hard mask cap 18P remain beneath the fin protective structure 24 in the gate region. In the illustrated embodiment, each hard mask cap 18P can be removed from the exposed portions of each silicon germanium alloy structure 16P which are not protected by fin protective structure 24 utilizing an etch process that follows the etch used to define the dielectric spacer of fin protective structure 24. In such an embodiment, the etch may be an anisotropic etch. In other embodiments, the exposed portions of each hard mask cap 18P not protected by fin protective structure 24 can be removed during the etch used to define the dielectric spacer of the fin protective structure 24.

After removing the hard mask cap 18P from atop portions of each silicon germanium alloy structure 16P not covered by the fin protective structure 24, a topmost surface and sidewall surfaces of each silicon germanium alloy structure 16P within the source/drain region are now exposed.

Figure 8:
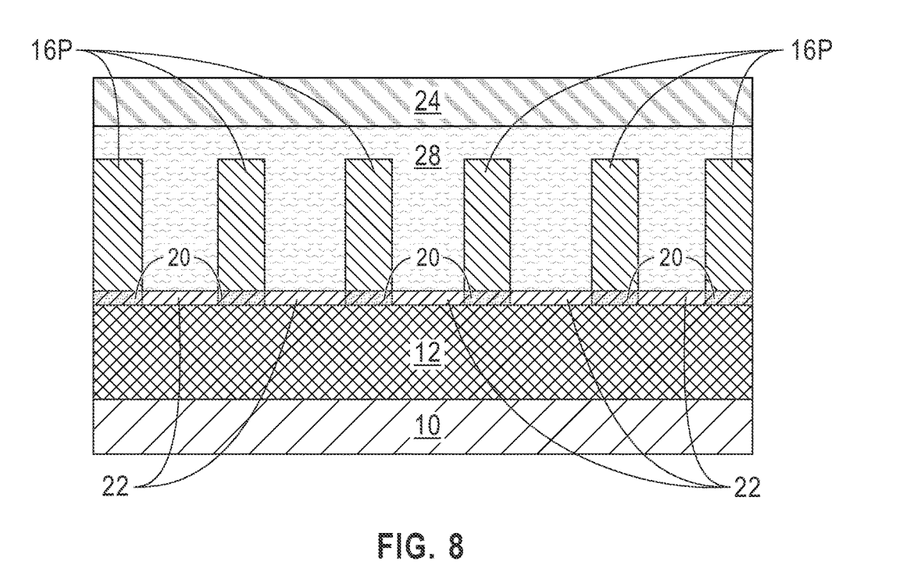
FIG. 8 is a cross sectional view in the source/drain region of the exemplary semiconductor structure of FIG. 7 after epitaxially growing a source/drain structure from exposed portions of each germanium graded silicon-containing region not protected by the fin protective structure.

Referring now to FIG. 8, there is illustrated the exemplary semiconductor structure of FIG. 7 after epitaxially growing a source/drain structure 28 from exposed portions (i.e., surfaces) of each silicon germanium alloy structure 16P not protected by the fin protective structure 24 as well as exposed surfaces of each germanium graded silicon-containing region 22. As is shown, the source/drain structure 28 that is formed in the source/drain regions forms around the exposed surfaces of each silicon germanium alloy structure 16P. The source/drain structure 28 that is formed is of high quality. By "high quality" it is meant, a low defect, void free epitaxy merging the fins in contrast to the diamond shaped epitaxy grown off the (110)-sidewalls of the fins if the bottom up growth of the (100) planes does not contribute. Merging of prior art diamond shaped epitaxial structures grown around the fin will lead to voids in the epitaxy at the bottom space between the fins. Moreover, the epitaxial semiconductor used in merging of prior art diamond shaped epitaxial structures is very defective due to the merge in misaligned lattice planes.

The source/drain structure 28 that is formed on one side of the fin protective structure 24 provides a source structure of the exemplary semiconductor structure of the present application, while the source/drain structure 28 that is formed on the other side of the fin protective structure 24 forms a drain structure of the exemplary semiconductor structure of the present application. The source/drain structure 28 comprises any semiconductor that includes an n-type or a p-type dopant. In some embodiments, source/drain structure 28 comprises a same semiconductor material as the silicon germanium alloy structures 16P. In other embodiments, source/drain structure 28 comprises a different semiconductor material, e.g., silicon, than the silicon germanium alloy structures 16P.

The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate, examples of n-type dopants, i.e., impurities, include, but are not limited to, antimony, arsenic and phosphorous. The concentration of dopants within semiconductor material the provides the source/drain structure 28 can be within ranges typically used in forming metal oxide semiconductor field effect transistors (MOSFETs).

The semiconductor material that provides the source/drain structure 28 can be formed utilizing an epitaxial deposition process such as that mentioned previously herein. The dopant can be introduced into the semiconductor material that provides the source/drain structure 28 during the growth of the semiconductor material, or after growth of an intrinsic semiconductor utilizing gas phase doping. As is shown, the source/drain structure 28 has a height that is greater than a height of each silicon germanium alloy portion 16P, but less than the height of the protective fin structure 24. As is also shown, a portion of the source/drain structure 28 that is located between each silicon germanium alloy structure 16P directly contacts a topmost surface of the germanium graded silicon-containing region 22.

Figure 9:
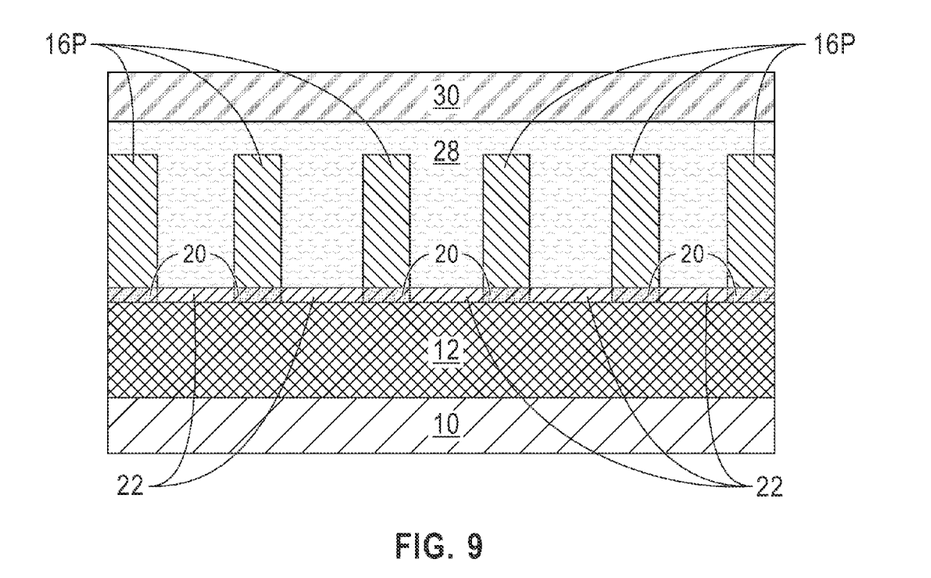
FIG. 9 is a cross sectional view in the source/drain region of the exemplary semiconductor of FIG. 8 after formation of an interlevel dielectric material.

Referring now to FIG. 9, there is illustrated the exemplary semiconductor of FIG. 8 after formation of an interlevel dielectric (ILD) material 30. The ILD material 30 has a topmost surface that is coplanar with a topmost surface of the fin protective structure 24. The ILD material 30 is located on an outer vertical sidewall of the dielectric spacer of the protective fin structure 24, and the ILD surrounds the protective fin structure 24.

In some embodiments, the ILD material 30 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the ILD material 30. The use of a self-planarizing dielectric material as ILD material 30 may avoid the need to perform a subsequent planarizing step.

In one embodiment, the ILD material 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 30, a planarization process or an etch back process follows the deposition of the ILD material 30. The thickness of the ILD material 30 that can be employed in the present application may vary depending on the type of dielectric material employed as well as the method that was employed in forming the same. In one embodiment, the ILD material 30 has a thickness from 80 nm to 500 nm. Other thicknesses that are greater or lesser than the range provided above can also be used for the ILD material 30.

Figure 10:
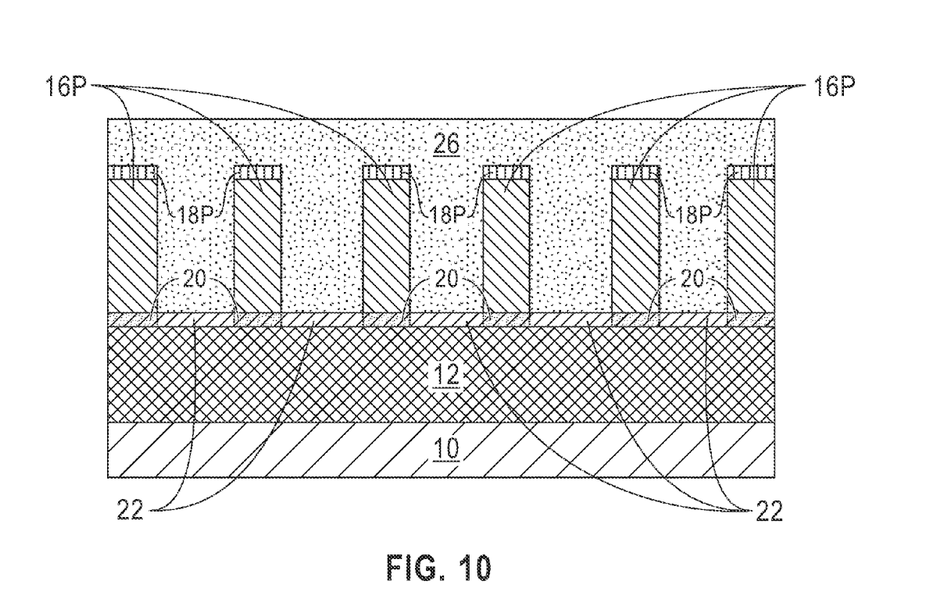
FIG. 10 is a cross sectional view in the gate region of the exemplary semiconductor structure shown in FIG. 9 after removing the at least one sacrificial material portion.

Referring now to FIG. 10, there is illustrated the exemplary semiconductor structure shown in FIG. 9 and in the gate region after removing the at least one sacrificial material portion of protective fin structure 24. The at least one sacrificial material portion of the protective fin structure 24 may be removed utilizing an etch process (or etching processes) that is (are) selective in removing the at least one sacrificial material portion. The removal of the at least one sacrificial material portion exposed sidewalls of the dielectric spacer 26.

Figure 11:
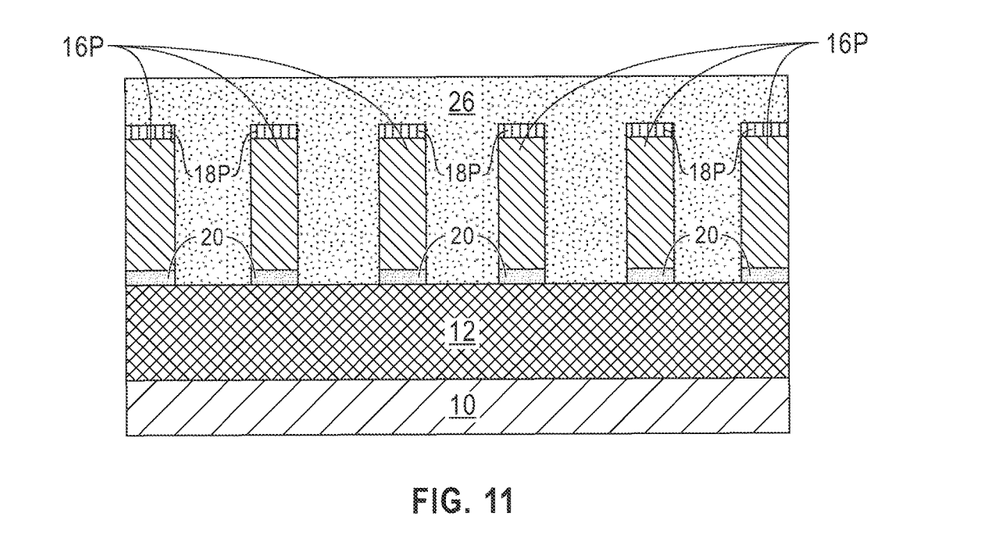
FIG. 11 is a cross sectional view in the gate region of the exemplary semiconductor structure of FIG. 10 after removing each germanium graded silicon-containing region from the gate region.

Referring now to FIG. 11, there is illustrated the exemplary semiconductor structure of FIG. 10 and in the gate region after removing exposed portions of the germanium graded silicon-containing region 22. During this step of the present application, the germanium graded silicon-containing regions 22 are not removed from the source/drain regions. Instead, the germanium graded silicon-containing regions 22 remain beneath each source/drain structure 28 of the exemplary semiconductor structure of the present application. The removal of the germanium graded silicon-containing region 22 within the gate region can be performed utilizing an anisotropic etching process that is selective in removing the germanium graded silicon-containing region 22 that are exposed in the gate region. In one example, reactive ion etching (RIE) can be used to remove the germanium graded silicon-containing regions 22 within the gate region.

Figure 12:
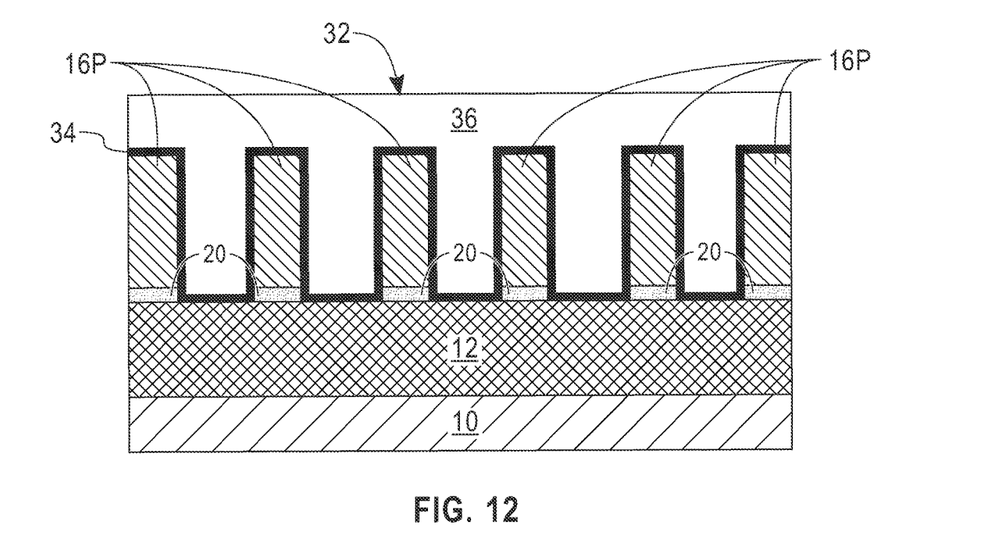
FIG. 12 is a cross sectional view in the gate region of the exemplary semiconductor structure shown in FIG. 11 after formation of a functional gate structure.

Referring now to FIG. 12, there is illustrated the exemplary semiconductor structure shown in FIG. 11 and in the gate region after forming a functional gate structure 32. In some embodiments (and as shown), each hard mask cap 18P can be removed from each silicon germanium alloy structure 16P utilizing an etch as mentioned above in removing each hard mask cap from the source/drain regions. In other embodiments, each hard mask cap 18P may remain in the final structure. By "functional gate structure" it is meant a permanent gate structure used to control output current (i.e., flow of carriers in the channel) of a semiconducting device through electrical or magnetic fields. The functional gate structure 32 that is formed includes a gate material stack of, from bottom to top, a gate dielectric portion 34 and a gate conductor portion 36. An optional gate cap portion (not shown) may be present atop the gate conductor portion 36. Although a single functional gate structure 32 is described and illustrated, a plurality of a functional gate structures can be formed. Each functional gate structure that is formed straddles each silicon germanium alloy structure 16P and the underlying silicon germanium alloy base portion 20 (i.e., the silicon germanium alloy fin). By "straddles", it is meant that one part of the functional gate structure is located on one side of the silicon germanium alloy fin (16P, 20), and another part of the functional gate structure is located on another side of the silicon germanium alloy fin (16P, 20).

The gate dielectric portion 34 comprises a gate dielectric material. The gate dielectric material that provides the gate dielectric portion 34 can be an oxide, nitride, and/or oxynitride. In one example, the gate dielectric material that provides the gate dielectric portion 34 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion 34.

The gate dielectric material used in providing the gate dielectric portion 34 can be formed by any deposition process including, for example, chemical vapor deposition (CVD), plasma enhanced chemical vapor deposition (PECVD), physical vapor deposition (PVD), sputtering, or atomic layer deposition. In some embodiments and when different functional gate structures are formed, a first set of functional gate structure may comprise a first gate dielectric portion, while a second set of functional gate structures may comprise a second gate dielectric portion that differs in composition from the first gate dielectric portion. When a different gate dielectric material is used for the gate dielectric portions, block mask technology can be used. In one embodiment of the present application, the gate dielectric material used in providing the gate dielectric portion 34 can have a thickness in a range from 1 nm to 10 nm. Other thicknesses that are lesser than, or greater than, the aforementioned thickness range can also be employed for the gate dielectric material.

The gate conductor portion 36 comprises a gate conductor material. The gate conductor material used in providing the gate conductor portion 36 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, gate conductor portion 36 may comprise an nFET gate metal. In other embodiments, gate conductor portion 36 may comprise a pFET gate metal.

The gate conductor material used in providing the gate conductor portion 36 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of more than one functional gate structure, block mask technology can be used. In one embodiment, the gate conductor material used in providing the gate conductor portion 36 has a thickness from 1 nm to 100 nm. Other thicknesses that are lesser than, or greater than, the aforementioned thickness range can also be employed for the gate conductor material used in providing the gate conductor portion 36.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

The functional gate structure 32 can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a silicon germanium alloy fin located directly on a portion of an insulator layer;
   a functional gate structure straddling over only a portion of said silicon germanium alloy fin;
   a source structure having a bottommost surface and located on one side of said functional gate structure and a drain structure having a bottommost surface and located on another side of said functional gate structure, wherein each of said source structure and said drain structure directly contacts sidewall surfaces and a topmost surface of an exposed portion of said silicon germanium alloy fin not containing said functional gate structure; and
   a germanium graded silicon-containing region present at a footprint of said exposed portion of said silicon germanium alloy fin not containing said functional gate structure, wherein said bottommost surface of each of said source structure and said drain structure directly contacts a surface of said germanium graded silicon-containing region.

2. The semiconductor structure of claim 1, wherein said germanium graded silicon-containing region has a germanium content that decreases inward from each sidewall surface to a central portion of said germanium graded silicon-containing region.

3. The semiconductor structure of claim 2, wherein said central portion of each of said germanium graded silicon-containing region comprises silicon with no germanium.

4. The semiconductor structure of claim 1, wherein a semiconductor material of said source structure and said drain structure has a same crystal orientation as said silicon germanium alloy fin and said germanium graded silicon-containing region.

5. The semiconductor structure of claim 4, wherein said source structure and said drain structure are free of voids.

6. The semiconductor structure of claim 1, wherein said source structure and said drain structure have a height that is greater than a height of said silicon germanium alloy fin.

7. The semiconductor structure of claim 1, further comprising a dielectric material located on said source structure and said drain structure.

8. The semiconductor structure of claim 1, wherein each germanium graded silicon-containing region has a bottommost surface directly contacting said insulator layer.

9. The semiconductor structure of claim 1, further comprising a dielectric spacer located between the functional gate structure and said source structure and said drain structure.

10. The semiconductor structure of claim 1 wherein said functional gate structure comprises a gate dielectric portion and an overlying gate conductor portion.

11. A semiconductor structure comprising:

a silicon germanium alloy fin located directly on a portion of an insulator layer;

a functional gate structure straddling over only a portion of said silicon germanium alloy fin;

a source/drain structure having a bottommost surface and located on each side of said functional gate structure and directly contacting sidewall surfaces and a topmost surface of an exposed portion of said silicon germanium alloy fin not containing said functional gate structure; and a germanium graded silicon-containing region that is present at a footprint of said exposed portion of said silicon germanium alloy fin not containing said functional gate structure, wherein said bottommost surface of said source/drain structure directly contacts a surface of said germanium graded silicon-containing region.

* * * * *